United States Patent
Samples

(10) Patent No.: US 8,410,601 B2
(45) Date of Patent: Apr. 2, 2013

(54) RF PACKAGE

(75) Inventor: Benjamin A. Samples, Bend, OR (US)

(73) Assignee: Microsemi Corporation, Bend, OR (US)

( * ) Notice: Subject to any disclaimer, the term of this patent is extended or adjusted under 35 U.S.C. 154(b) by 112 days.

(21) Appl. No.: 12/938,974

(22) Filed: Nov. 3, 2010

(65) Prior Publication Data

US 2011/0116237 A1   May 19, 2011

Related U.S. Application Data

(60) Provisional application No. 61/261,337, filed on Nov. 15, 2009.

(51) Int. Cl.
*H01L 23/31* (2006.01)
(52) U.S. Cl. ........ 257/704; 257/696; 257/728; 257/732; 257/E23.124; 257/E23.128; 361/719
(58) Field of Classification Search .................. 257/696
See application file for complete search history.

(56) References Cited

U.S. PATENT DOCUMENTS

| | | |
|---|---|---|
| 3,387,190 A | 6/1968 | Winkler |
| 3,555,375 A | 11/1968 | Hilbers |
| 4,908,694 A | 3/1990 | Hidaka et al. |
| 4,996,582 A | 2/1991 | Nagahama |
| 5,155,575 A | 10/1992 | Zimmermann |
| 5,170,337 A | 12/1992 | Borowiec et al. |
| 5,524,339 A | 6/1996 | Gorowitz et al. |
| 5,548,099 A | 8/1996 | Cole, Jr. et al. |
| 5,683,943 A | 11/1997 | Yamada |
| 5,939,774 A | 8/1999 | Yamada |
| 6,008,068 A | 12/1999 | Yamada |
| 6,943,293 B1 | 9/2005 | Jeter et al. |

(Continued)

FOREIGN PATENT DOCUMENTS

| EP | 0367680 A1 | 5/1990 |
|---|---|---|
| EP | 0844663 A1 | 5/1998 |

(Continued)

OTHER PUBLICATIONS

Kyocera Semiconductor Parts Power Transistor Packages, Kyocera website, 2009.

(Continued)

*Primary Examiner* — Calvin Lee
*Assistant Examiner* — Abul Kalam
(74) *Attorney, Agent, or Firm* — Marger Johnson & McCollom, P.C.

(57) ABSTRACT

An RF package includes a substrate mountable on a base plate, a non-conductive cover overlying the substrate, and quasi-serpentine stepped source leads attached to an upper surface of the substrate and extending from at least one of a pair of opposite sides of the upper surface of the substrate to tapered lower surfaces of the cover. The cover includes a recess to receive the substrate. The recess includes stress distribution surface areas to engage and press outer edge portions of opposite sides of the substrate against a base plate or heat sink. The tapered lower surfaces of the cover engage with and press against the stepped source leads when securing the RF package to the base plate or heat sink using one or more fasteners or bolts. The cover includes structural features to improve preferential deformation when a mounting force is applied.

9 Claims, 4 Drawing Sheets

U.S. PATENT DOCUMENTS

| | | |
|---|---|---|
| 7,105,931 B2 | 9/2006 | Attarwala |
| 7,134,197 B2 | 11/2006 | Shiffer et al. |
| 7,557,434 B2 | 7/2009 | Malhan et al. |
| 2004/0061221 A1 | 4/2004 | Schaffer |
| 2004/0195701 A1 | 10/2004 | Attarwala |
| 2005/0136569 A1 | 6/2005 | Shiffer et al. |
| 2006/0084254 A1 | 4/2006 | Attarwala |
| 2007/0096297 A1* | 5/2007 | Frey .................. 257/706 |
| 2007/0145473 A1 | 6/2007 | Asano et al. |
| 2008/0054425 A1 | 3/2008 | Malhan et al. |
| 2008/0054439 A1 | 3/2008 | Malhan et al. |
| 2008/0203558 A1* | 8/2008 | Tashiro et al. ............ 257/704 |
| 2008/0237840 A1 | 10/2008 | Alcoe et al. |
| 2009/0146280 A1 | 6/2009 | Shimazaki et al. |

FOREIGN PATENT DOCUMENTS

| | | |
|---|---|---|
| EP | 1632998 A1 | 3/2006 |
| EP | 1662565 A2 | 5/2006 |
| EP | 1796163 A1 | 6/2007 |
| GB | 2444293 A | 6/2008 |
| GB | 2444978 A | 6/2008 |
| WO | 2005062371 A2 | 7/2005 |

OTHER PUBLICATIONS

Product Information Sheet, Standard RF Packages Jul. 1998, 1998 Kyocera America, Inc., two pages.

Product Information Sheet, Standard Microwave Package Jul. 1997, 1998 Kyocera America, Inc., two pages.

Components for Wireless Communication Devices, http://global.kyocera.com/prdct/semicon/semi/wireless/index.html, downloaded from the internet, Oct. 27, 2010, Kyocera Corporation, two pages.

RF Power Transistor Packages, Components for Wireless Communication Devices, http://global.kyocera.com/prdct/semicon/semi/wireless/fet_pkg.html, downloaded from the internet, Oct. 27, 2010, Kyocera Corporation, one page.

* cited by examiner

US 8,410,601 B2

RF PACKAGE

CROSS REFERENCE TO RELATED APPLICATION

This application claims the benefit of U.S. Provisional Patent Application Ser. No. 61/261,337, filed Nov. 15, 2009, herein incorporated by reference.

BACKGROUND

1. Technical Field

This disclosure relates to RF power transistors, and more particularly to power transistor packages.

2. Discussion of Related Art

Conventional high-power RF power transistor packages use metal flanges that generally protrude from multiple sides of the device. Such flanges provide source electrical interconnects and a means for affixing the device to a heat sink. The flanged connections can be beneficial for high-frequency applications and usually include bolt holes outwardly positioned from the package for clamping the device to the heat sink.

An example of a prior-art RF power transistor package 100 having flanges 105 and 110 is show in FIG. 1. As shown in FIG. 1, the flanges 105 and 110 extend outwardly from the package and include bolt holes external to the body of the package. Securing the package to the heat sink and dissipating heat from the source connections is accomplished by bolting the package to the heat sink using the flanges.

However, the conventional art is cost-disadvantageous due to extra materials used in the construction of the package. Prior art packages are also deficient in other areas such as manufacturing simplicity. Moreover, the prior art approach to connecting source interconnects to the heat sink does not benefit from preferential deformation of the lid when mounting the package. Accordingly, a need remains for a lower-cost high-power RF power transistor package using less material, better connectivity features, and providing for preferential deformation of the package when affixing the device to the heat sink.

SUMMARY OF EMBODIMENTS OF THE INVENTION

In an example embodiment of the invention, an RF power transistor package is provided. The RF package can include, for example, a substrate mountable on a base plate, a non-conductive cover overlying the substrate, and quasi-serpentine stepped source leads attached to an upper surface of the substrate and extending from at least one of a pair of opposite sides of the upper surface of the substrate to tapered lower surfaces of the cover. The non-conductive cover can include a recess configured to receive the substrate. The recess forms a stress distribution surface area to engage and press outer edge portions of opposite sides of the substrate against the base plate.

One or more tapered lower surfaces of the cover extend from the recess toward outer edge portions of the cover. The tapered lower surfaces of the cover engage with and press against the stepped source leads when securing the RF package to the base plate or heat sink. Mounting the package to base plate or heat sink can involve the use of one or more fasteners or bolts inserted into bolt holes and through corresponding openings in the stepped source leads. The fasteners or bolts are received by mounting holes in the base plate or heat sink.

The cover includes structural features to improve preferential deformation when a mounting force is applied. For instance, the recess in the cover includes one or more notches at outer edges thereof, to provide stress concentration outwardly toward edges of the cover. The cover can also include a cavity disposed within the cover to receive one or more dies, one or more conductors, and at least portions of one or more gate leads, one or more drain leads, and the one or more stepped source leads. The cover can include sections having different thicknesses to provide rigidity to some portions of the cover while evenly distributing stress of the cover during preferential deformation thereof.

The foregoing and other features and advantages of the invention will become more readily apparent from the following detailed description of a preferred embodiment of the invention that proceeds with reference to the accompanying drawings.

DETAILED DESCRIPTION

Figure 1:
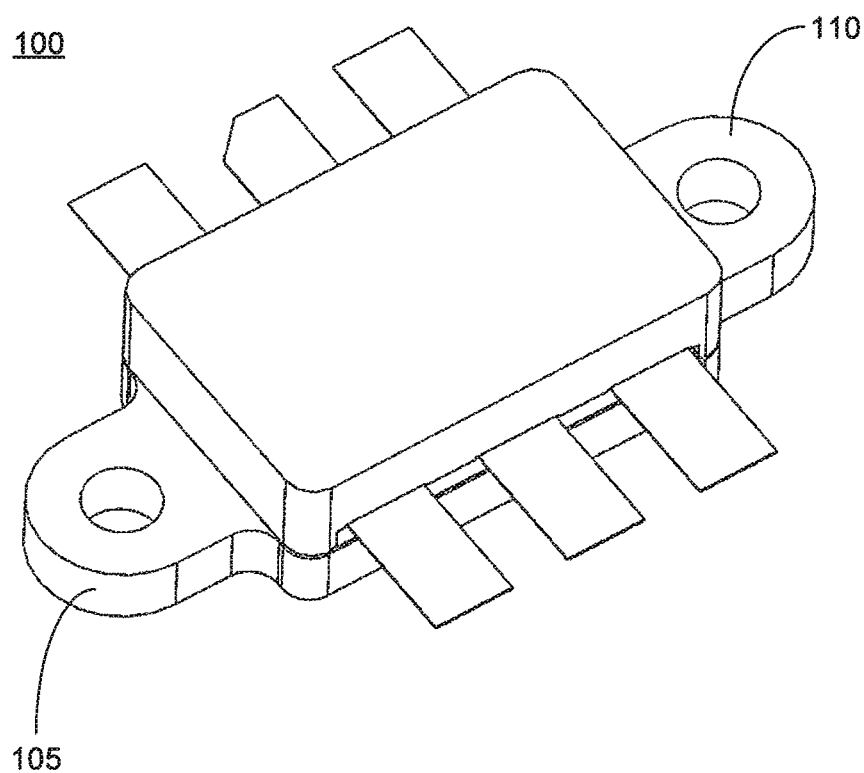
FIG. 1 illustrates a conventional RF power transistor package having outwardly protruding flanges used for source connections.
Figure 2:
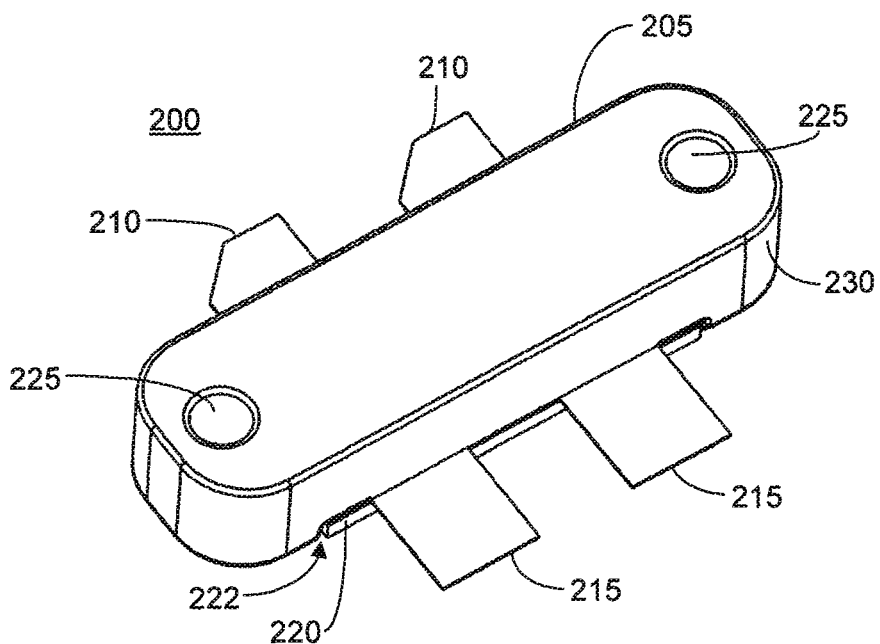
FIG. 2 illustrates a top perspective view of an RF power transistor package according to some embodiments of the present invention.
Figure 3:
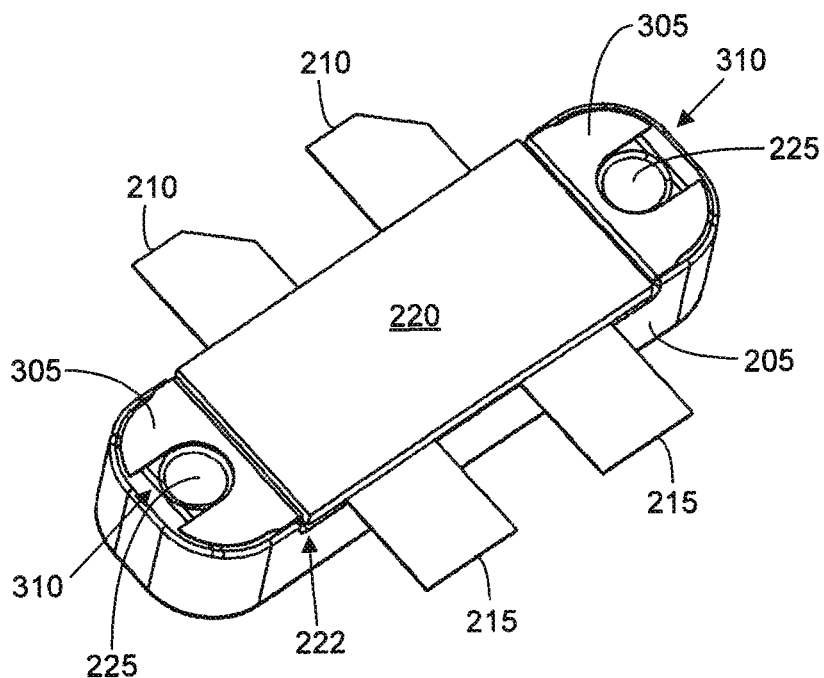
FIG. 3 illustrates a bottom perspective view of the RF power transistor package of FIG. 2, according to some embodiments of the present invention.
Figure 4:
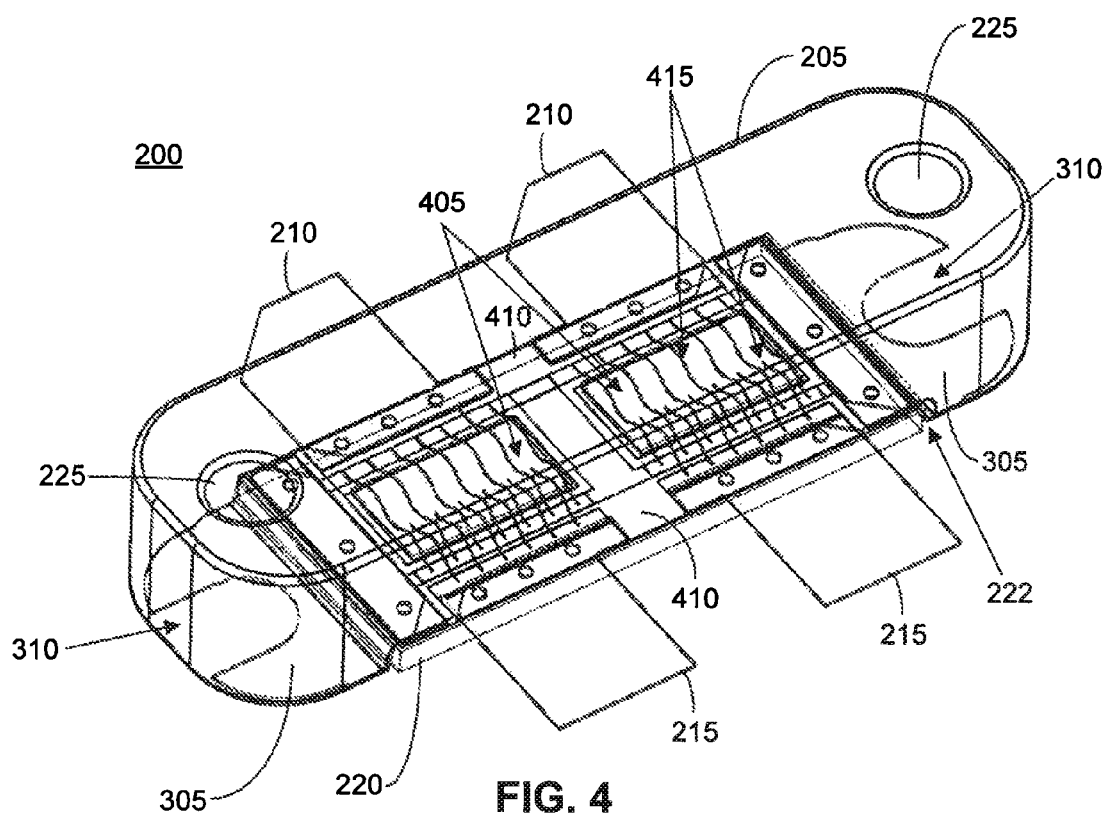
FIG. 4 illustrates a transparent view of the RF power transistor package of FIG. 2, including stepped source leads and other components disposed within or beneath the package, according to some embodiments of the present invention.

FIG. 2 illustrates a top perspective view and FIG. 3 illustrates a bottom perspective view of an RF power transistor package 200, according to some embodiments of the present invention. FIG. 4 illustrates a transparent view of the RF power transistor package 200 to facilitate an understanding of the stepped source leads 305 and other inventive features and components disposed within or beneath the package 200, according to some embodiments of the present invention. Reference is now made to FIGS. 2-4.

The RF power transistor package 200 includes a substrate 220 mountable on a base plate or heat sink (not shown). The substrate 220 is typically made of ceramic having high yield stress properties, although any suitable material can be used. One or more silicon dies 405 forming the circuitry of the device can be disposed on and/or affixed to the upper surface of the substrate 220.

A non-conductive cover 205 is structured to overlay and protect the substrate 220 and other components of the package. The cover 205, sometimes referred to as a "lid" can be unitary, resilient, generally rectangular with rounded corner edges 230, and overlying the substrate 220, silicon dies 405, wire bonds 415, stepped source leads 305, and portions of leads 210 and 215. The cover 205 is made of a material selected to provide high electrical insulation with low dielectric loss.

The cover material preferably has a high resistance to creep to avoid non-preferential deformations caused by numerous heat cycles. Materials such as Ultem® UC1200 Polyetherimide, Lexan® 920A Polycarbonate, Makrolon® 1804 Polycarbonate, or Ultem® 2300 can be used as the base material for the cover 205. Preferably, Ultem® 2300 is used due to its yield strength, creep resistance, and performance in an injection molding application. Injection molding applications are the preferred method for producing the cover 205 in large quantities.

The cover 205 includes a recess 222 to receive the substrate 220. The recess 222 forms a stress distribution surface area 410 to engage and press outer edge portions 410 of opposite sides of the substrate 220 against the base plate or heat sink. The recess 222 can also receive at least portions of a lead frame and/or leads associated with the RF package 200.

One or more stepped source leads 305 extend from at least one of a pair of opposite sides of an upper surface of the substrate 220 to the lower surfaces of the cover 205. Each source lead 305 is attached to the top of the ceramic substrate 220 using bolts, rivets, adhesive, or other suitable attaching means, and is electrically coupled to the dies 405. The stepped source leads 305 can be bent or folded in a quasi-serpentine fashion to form an electrical connection from the top of the substrate 220 to the base plate or heat sink, as will be further described below.

Gate leads 215 and drain leads 210 are attached to the top surface of the ceramic substrate 220 using the same or similar attaching means. The gate and drain leads are electrically coupled to the dies 405, and protrude in opposite directions from the other two sides of the substrate 220. The stepped source leads, gate leads and drain leads can be electrically coupled to the dies 405 using one or more electrical conductors, for example, such as wire bonds or "jumper" wires 415 illustrated in FIG. 4, or any other suitable connection.

Mounting or bolt holes 225 are arranged in the cover 205 and are aligned with corresponding openings 310 in the stepped source leads 305. Although the openings 310 are illustrated as elongated moon-shaped openings, other types of openings are contemplated such as circular openings that substantially match those of holes 225, among other possibilities. The mounting or bolt holes 225 are used for securing the RF package 200 including the substrate 220 and the stepped source leads 305 directly to the base plate or heat sink. The mounting or bolt holes 225 can be arranged in a pattern that matches the mounting pattern of preexisting RF power transistor packages or in entirely new mounting arrangements.

The stepped source leads 305 are disposed entirely beneath the non-conductive cover 205 and need not extend beyond the edges of the cover. In other words, the RF package includes flangeless source connections to the base plate or heat sink, providing an electrical connection from the top side or active portion of the substrate 220 to the underside or mounting surface of the RF package 200, entirely within and/or beneath the geometry of the cover 205.

Figure 5:
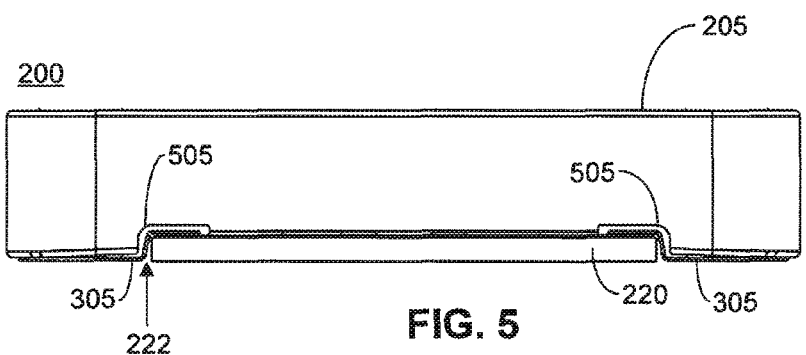
FIG. 5 illustrates a side view of the RF power transistor package of FIG. 2, including a recess in the package and the stepped source leads disposed beneath the package and extending from an upper surface of the substrate toward end portions of the package.
Figure 6:
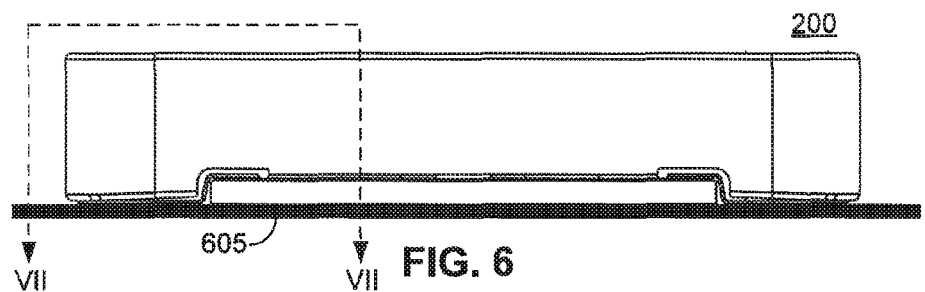
FIG. 6 illustrates another side view of the RF power transistor package of FIG. 2, showing the package affixed to a base plate or heat sink.
Figure 7:
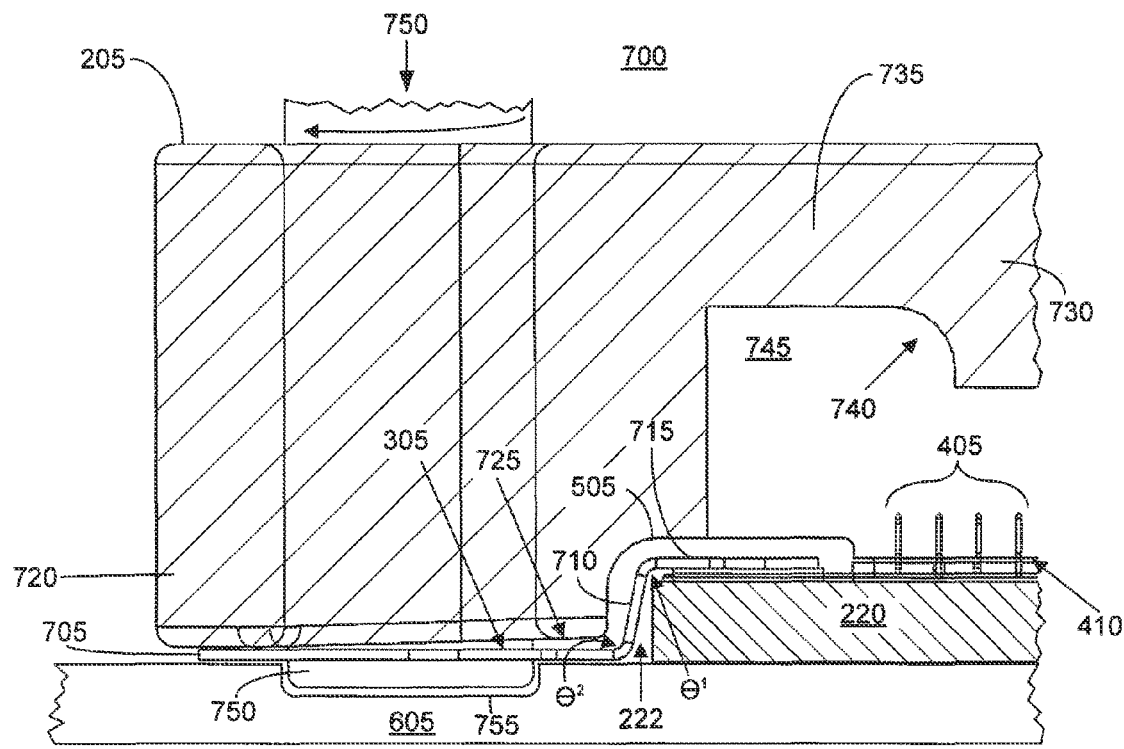
FIG. 7 illustrates a cross-sectional view of a portion of the RF power transistor package of FIG. 6, including a cavity internal to the package, and additional detailed features with respect to the stepped source leads.

FIG. 5 illustrates a side view of the RF power transistor package 200 of FIG. 2, including the recess 222 in the package and the stepped source leads 305 disposed beneath the package and extending from an upper surface of the substrate 220 toward end portions of the package. FIG. 6 illustrates another side view of the RF power transistor package 200 of FIG. 2, showing the package affixed to a base plate or heat sink 605. FIG. 7 illustrates an exploded cross-sectional view 700 of a portion of the RF power transistor package of FIG. 6 taken along lines VII-VII, including a cavity 745 internal to the package, and additional detailed features with respect to the stepped source leads 305. Reference is now made to FIGS. 5-7.

One or more tapered lower surfaces 725 extend from the recess 222 toward outer edge portions 720 of the cover 205. The tapered lower surfaces 725 provide an interface between the RF package and the base plate or heat sink, which results in consistent and preferential lid deformation and/or creep resistance due to plastic relaxation of the lid. The one or more stepped source leads 305 extend from at least one of a pair of opposite sides of an upper surface of the substrate 220 to the tapered lower surfaces 725 of the cover 205. The stepped source leads 305 can extend partially toward the outer edge portions 720 of the cover 205 as illustrated, or in an alternative embodiment, the stepped source leads 305 can extend entirely to the outer edge portions 720 of the cover 205.

Each of the stepped source leads 305 includes a first horizontal section 715, a slanted section 710, and a second horizontal section 705. The first section 715 is coupled to the upper surface of the substrate 220, which defines a horizontal dimension of the first section 715. The slanted section 710 extends in a sloped direction from the first section at an angle $\theta^1$ relative to the horizontal dimension of the first section. The angle $\theta^1$ is preferably 100 degrees or thereabout, but in some embodiments, the angle $\theta^1$ can be any suitable angle between 90 and 170 degrees. A second horizontal section 705 extends from the slanted section at an angle $\theta^2$ relative to the slanted direction of the slanted section. The angle $\theta^2$ is preferably 100 degrees or thereabout, but in some embodiments, the angle $\theta^2$ can be any suitable angle between 90 and 170 degrees.

The first horizontal section 715, slanted section 710, and second horizontal section 705 form a contiguous stepped source lead 305 located beneath the cover 205. As mentioned above, the stepped source leads 305 can be bent or folded in a quasi-serpentine embodiment. The transitions from one section of a stepped source lead 305 to another is defined by angles $\theta^1$ and $\theta^2$, which can be rounded or sharp. The tapered lower surfaces 725 of the cover 205 provide consistent and repeatable application of mounting force on the stepped source leads 305 to ensure high surface contact area between the source leads and the base plate or heat sink 605.

In addition, consistent contact pressure is applied by the tapered lower surfaces 725 to the source leads 305 to also enhance contact and to prevent creep resistance that could otherwise be caused by plastic relaxation of the cover. More specifically, the tapered lower surfaces 725 of the cover 205 are structured to engage with and press against the second horizontal section 705 of the one or more stepped source leads 305, even over the course of multiple heating and/or usage cycles.

Furthermore, one or more notches 505 in the cover 205 are disposed at outer edges of the recess 222. The notches 505 provide stress concentration outwardly toward edges of the cover 205. The notches 505 also provide preferential deformation of the cover 205 about the first horizontal section 715 and slanted section 710 of the stepped source leads 305, particularly when securing the RF package 200 to the base plate or heat sink 605 using, for example, one or more fasteners or bolts 750.

A cavity 745 is disposed within the cover 205 to receive the one or more dies 405, one or more conductors such as the wire bonds 415, and at least portions of the one or more gate leads 215, drain leads 210, and stepped source leads 305. The cavity 745 includes a first section 730 having a first thickness to provide rigidity to the central portion of the cover 205, one or more additional sections 735 having a second thickness less than the first thickness, and a curved section 740 connecting the first section to the one or more additional sections.

The one or more additional sections 735 and the curved section 740 are configured to evenly distribute stress of the cover 205 during preferential deformation thereof when securing the one or more stepped source leads 305 and the substrate 220 to the base plate 605 using, for example, the one or more fasteners or bolts 750. Stress is further distributed on the substrate 220 by the lid to substrate bearing area 410, which makes contact with and presses against the outer edge portions 410 of opposite sides of the substrate 220, which in turn presses the substrate 220 and stepped source leads 350 against the base plate or heat sink 605.

Fasteners or bolts 750 can be inserted through holes 225 and openings 310 into mounting holes 755 of the base plate or heat sink 605, which securely mounts the RF package 200, including the cover 205, substrate 220, leads, and other associated components of the RF package to the base plate or heat sink 605. While one section of the RF package is shown along lines VII-VII in FIG. 7, it should be understood that a mirror image of the components, or at least similar components, of such a section can be embodied in the other end portion of the RF package.

Having illustrated and described the principles of our invention in various embodiments thereof, it should be apparent that the invention can be modified in arrangement, detail and application without departing from such principles. While some embodiments described herein are especially useful in packaging RF power devices, embodiments of the invention can be configured for use with other types of devices such as lower frequency devices.

For instance, the terminology "gate," "source" and "drain" leads pertains to MOSFET type devices. It is contemplated that embodiments of the invention can also be used with bipolar type devices and IGBT devices. In the case of bipolar devices, gate corresponds to base, source corresponds to emitter and drain corresponds to collector. In the case of an IGBT device, gate remains gate, source corresponds to emitter and drain corresponds to collector. The terms gate, source and drain will be used throughout but are meant to include base-emitter-collector and gate-emitter-collector leads.

I claim all modification and variations coming within the spirit and scope of the following claims.

The invention claimed is:

1. An RF package, comprising:
    a substrate mountable on a base plate;
    a non-conductive cover overlying the substrate and including:
        a recess configured to receive the substrate, the recess forming a stress distribution surface area to engage and press outer edge portions of opposite sides of the substrate against the base plate;
        one or more tapered lower surfaces extending from the recess toward outer edge portions of the cover;
    one or more stepped source leads extending from at least one of a pair of opposite sides of an upper surface of the substrate to the one or more tapered lower surfaces of the cover;
    one or more gate and drain leads extending from at least one of a pair of opposite sides of an upper surface of the substrate;
    one or more dies disposed on the substrate;
    one or more conductors electrically coupling the one or more gate leads, drain leads, and stepped source leads to the one or more dies; and
    a cavity disposed within the cover to receive the one or more dies, the one or more conductors, and at least portions of the one or more gate leads, drain leads, and stepped source leads, wherein the cover further includes:
        a first section having a first thickness between the cavity and the top surface of the cover to provide rigidity to the central portion of the cover;
        one or more additional sections having a second thickness between the cavity and the top surface of the cover, the second thickness less than the first thickness; and
        a curved section connecting the first section to the one or more additional sections,
        wherein the one or more additional sections and the curved section are configured to evenly distribute stress of the cover during preferential deformation thereof when securing the one or more stepped source leads and the substrate to the base plate.

2. The RF package of claim 1, wherein the cover further includes a bolt hole for receiving a bolt in each outer edge portion to clamp the cover against the base plate and wherein the one or more tapered lower surfaces of the cover face the base plate and are angled relative to the base plate to provide a progressively increasing mounting force on the stepped source leads as the bolts are tightened.

3. The RF package of claim 1, wherein each of the one or more stepped sources leads includes:
    a first section coupled to the upper surface of the substrate, the upper surface of the substrate defining a horizontal dimension of the first section;
    a second section extending in a slanted direction from the first section at an angle relative to the horizontal dimension of the first section; and
    a third section extending from the second section at an angle relative to the slanted direction of the second section.

4. The RF package of claim 3, wherein the first, second, and third sections of the source leads form a contiguous stepped source lead located beneath the cover.

5. previously presented) The RF package of claim 3, wherein the one or more tapered lower surfaces of the cover are structured to engage with and press against the third section of the one or more stepped source leads.

6. The RF package of claim 3, wherein the recess includes one or more notches disposed at outer edges thereof, the one or more notches structured to provide:
    stress concentration outwardly toward edges of the cover; and
    deformation of the cover about the first and second sections of the one or more stepped source leads.

7. The RF package of claim 1, wherein the base plate is a heat sink attachable to the one or more stepped source leads.

8. The RF package of claim 1, wherein the cover comprises a material having a resistance to creep, high electrical insulation, high yield strength, and low dielectric loss.

9. The RF package of claim 1, further comprising one or more bolt holes arranged in the cover and aligned with corresponding openings in the one or more stepped source leads, the one or more bolt holes configured to receive one or more bolts to secure the substrate and the one or more stepped source leads to the base plate.

* * * * *